United States Patent [19]
Jayaraman

[11] Patent Number: 6,157,693
[45] Date of Patent: Dec. 5, 2000

[54] LOW VOLTAGE DUAL-MODULUS PRESCALER CIRCUIT USING MERGED PSEUDO-DIFFERENTIAL LOGIC

[75] Inventor: Arun Jayaraman, San Diego, Calif.

[73] Assignee: Conexant Systems, Inc., Newport Beach, Calif.

[21] Appl. No.: 09/163,862

[22] Filed: Sep. 30, 1998

[51] Int. Cl.$^7$ ................................................. H03K 21/00
[52] U.S. Cl. .............................. 377/47; 327/115; 327/117
[58] Field of Search ............................... 377/47; 327/115, 327/117

[56] References Cited

U.S. PATENT DOCUMENTS

| | | | |
|---|---|---|---|
| 4,606,059 | 8/1986 | Oida | 377/47 |
| 5,195,111 | 3/1993 | Adachi et al. | 377/47 |
| 5,590,163 | 12/1996 | Dufour | 277/47 |
| 5,859,890 | 1/1999 | Shurboff et al. | 377/47 |
| 5,948,046 | 9/1999 | Hagberg | 377/47 |
| 5,987,089 | 11/1999 | Hawkins, Jr. | 377/47 |

FOREIGN PATENT DOCUMENTS

| | | |
|---|---|---|
| 61-280121 | 12/1986 | Japan . |
| 01016011 | 1/1989 | Japan . |
| 2 137 384 | 10/1984 | United Kingdom . |

*Primary Examiner*—Margaret R. Wambach
*Attorney, Agent, or Firm*—Lyon & Lyon LLP

[57] ABSTRACT

A prescaler circuit for a frequency synthesizer includes two circuit blocks, each having an OR gate coupled with a master-slave flip-flop. An input clock signal having a frequency FN is supplied to the flip-flop of each circuit block, and an output clock signal having a frequency FN/2 or FN/3 is generated in response. A control signal supplied to the OR gate of the second circuit block determines whether the frequency will be divided by 2 or by 3. The circuit blocks generate differential output signals, and common-mode signals are generated for supply to the OR gate inputs by summing and dividing the differential output signals with high value resistors.

17 Claims, 4 Drawing Sheets

LOW VOLTAGE DUAL-MODULUS PRESCALER CIRCUIT USING MERGED PSEUDO-DIFFERENTIAL LOGIC

FIELD OF THE INVENTION

The present invention relates generally to frequency synthesizers for communications devices, and more particularly to a novel prescaler circuit for use in a frequency synthesizer which significantly reduces the amount of current consumed by the synthesizer.

BACKGROUND OF THE INVENTION

Wireless communication devices such as handsets typically include low power frequency synthesizers that monitor a plurality of frequency channels to determine whether any transmissions are present on those channels. If a transmission is found to be present on a particular channel, the synthesizer tunes to the frequency of that channel to permit the user to receive the incoming transmission. Since the frequency synthesizer is usually the first circuit in the communications device that is actuated, and since it is actuated at frequent intervals (as often as once per millisecond) to continually monitor for incoming transmissions, optimization of its performance and minimization of the current consumed is desirable.

There have been several approaches to improving the performance of synthesizers. The "technology improvement" approach is concerned primarily with developing devices that have a lower output capacitance and/or a lower substrate capacitance. Lower capacitances permit the device to switch faster. In particular, emitter-coupled logic (ECL) utilizes this approach to achieve significantly faster operational speeds. ECL has a significant drawback, however, in that current is continually consumed, even when devices employing this technology are not switching (changing the states of the inputs and outputs).

Another approach is reduction of current consumption through improvement of circuit topology. That is, the amount of current consumed can be reduced if the size of the circuit and/or the number of circuit components can be reduced. Synthesizers typically include a prescaler circuit, which divides the input frequency by a desired factor. As the prescaler is one of the most current-hungry components in the synthesizer, this is where optimization and current consumption reduction efforts have been focused.

SUMMARY OF THE INVENTION

The present invention provides a prescaler circuit for a frequency synthesizer that is of reduced size and utilizes a reduced number of components relative to the prior art, and hence, that consumes less current than prior art circuits.

In one embodiment of this invention, a prescaler circuit includes two blocks of merged OR/flip-flop logic. An input clock signal having a frequency FN is supplied to the flip-flop of each block, and an output clock signal having a frequency of either FN/2 or FN/3 is generated. A control signal input to the OR gate of the second block determines whether the output frequency is divided by two or by three.

According to one aspect of the invention, the prescaler circuit utilizes primarily differential signals in order to deal with the problem of common-mode noise. Single-ended common-mode signals, however, are also provided at OR gate inputs in order to ensure proper functioning of the OR gates. In order to extract the common-mode signal, the actual and inverted components of a differential signal are summed and divided with high value resistors, yielding a common-mode signal that is supplied to the OR gates.

The present invention also provides a method for prescaling a frequency by a factor of 2 or 3. First and second circuit blocks are provided, wherein each block is an OR gate coupled with a master-slave flip-flop. A clock signal having a frequency FN is input to each block, and a control signal is input to one of the blocks. Depending on the value of the control signal, a signal having a frequency FN/n is output from one of the blocks.

Further features and advantages of the invention, as well as the structure and operation of particular embodiments of the invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements.

DETAILED DESCRIPTION OF PREFERRED EMBODIMENTS

Figure 1:
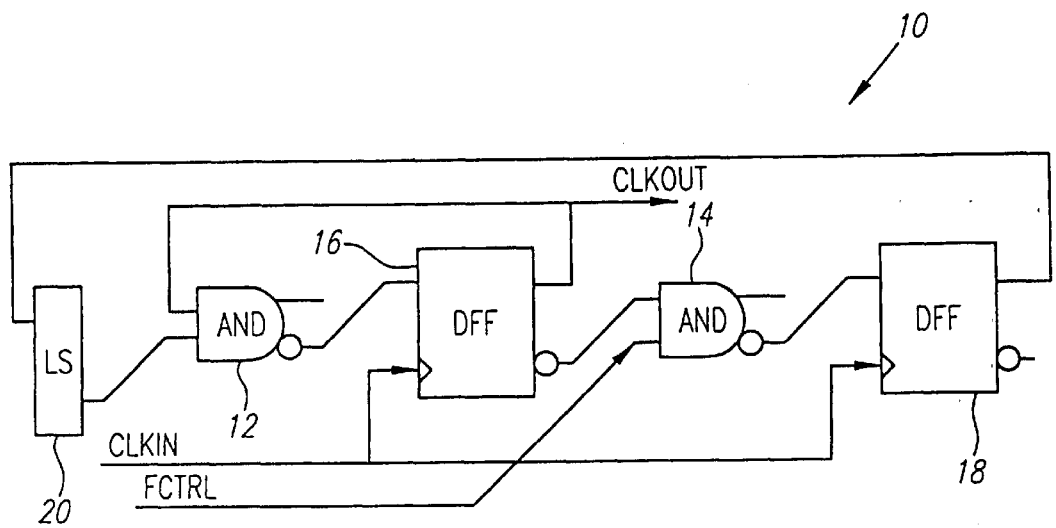
FIG. 1 is a block diagram illustrating a ⅔ prescaler circuit.
Figure 2:
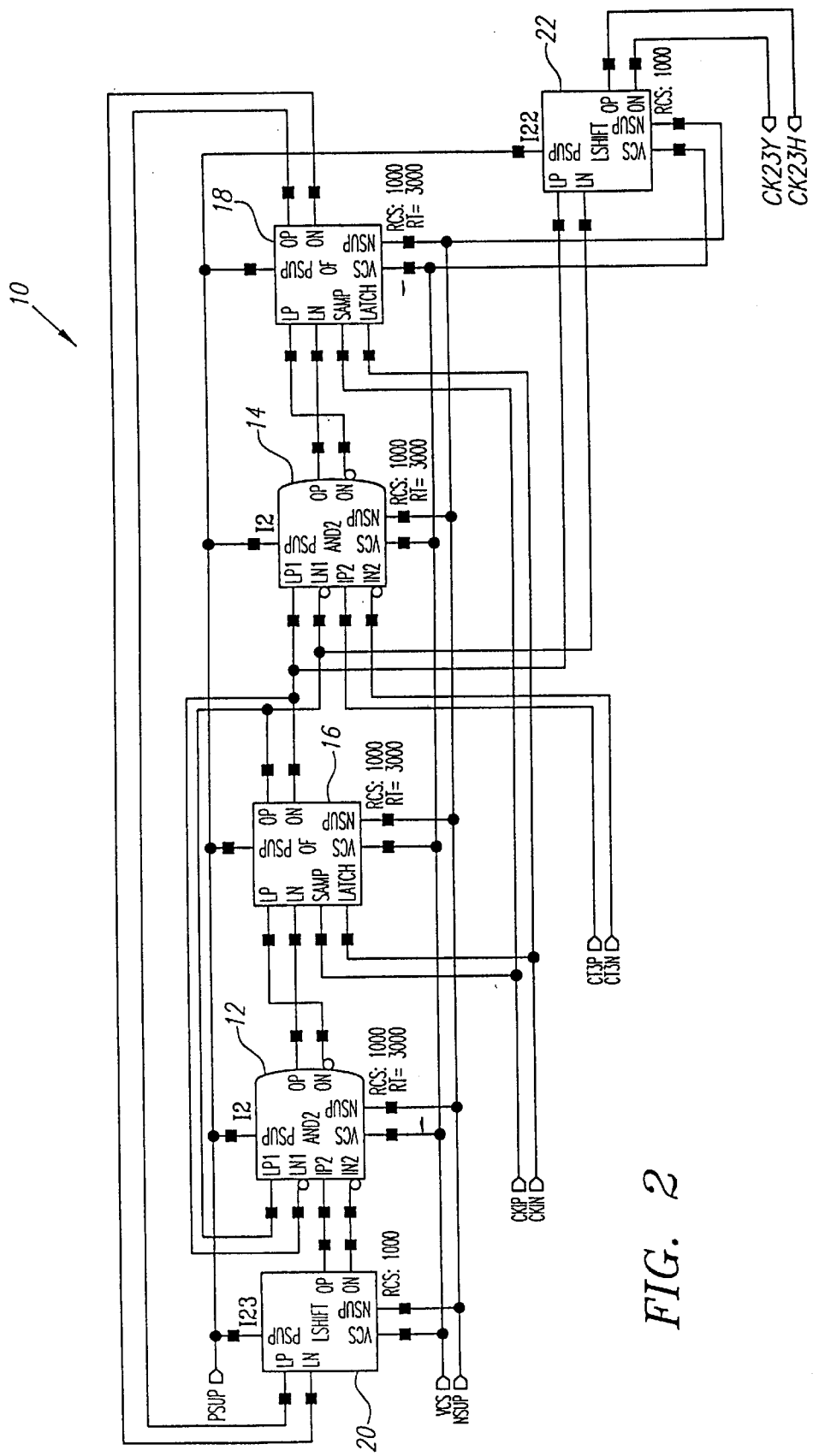
FIG. 2 is a schematic diagram illustrating the prescaler circuit of FIG. 1 in greater detail.

A ⅔ prescaler circuit 10 is illustrated in FIGS. 1 and 2. Although it incorporates some aspects and features of the present invention, circuit 10 is illustrated primarily for purposes of establishing a context for, and contrasting with, the present invention Applicant neither intends nor makes any admission regarding the prior art effect of circuits 10.

Circuit 10 is known as a ⅔ prescaler since, contingent on the setting of a control signal, the frequency of an input signal is divided by either a factor of two or of three (i.e., circuit 10 is a "dual modulus" circuit). Other division factors may be realized by combining the base prescaler circuit with additional logic. Prescaler circuit 10 includes two AND gates 12 and 14, two master-slave flip-flops 16 and 18, and two level shifters 20 and 22 (level shifter 22 is illustrated in FIG. 2 only). With reference to FIG. 1, a clock pulse generator feeds a clock signal $clk_{in}$ having a pulse frequency FN into circuit 10 and, contingent on the setting of control signal $f_{ctrl}$, circuit 10 generates an output clock signal $clk_{out}$ having a pulse frequency of either FN/2 or FN/3.

Prescaler circuit 10 is illustrated in greater detail in FIG. 2. Each of the components of circuit 10 is connected to a bias voltage $v_{cs}$ a ground signal at the ports designated $n_{sup}$ and a supply voltage $V_{cc}$ at the ports designated $P_{sup}$. The connections between the components of circuit 10 are differential or "double-ended" connections, that is, both the actual logical or "positive" value of a signal as well as its inverted value are utilized. Differential signals are utilized to address the problem of common-mode noise. Common-mode noise arises when capacitances existing between circuit components and lines become coupled to a signal line, resulting in an offset or inaccurate signal level. Dual lines carrying differential signals, however, are so proximate that any amount of capacitance or noise coupled to one line will be coupled to its companion differential line in nearly exactly the same amount. Hence, the undesired common-mode noise is coupled by exactly the same amount to each differential line, with the result that it is cancelled out when the difference is taken. This is known as common-mode rejection; any commonmode noise coupled to the differential logic is rejected.

Differential input clock signals $cki_p$ and $cki_n$, having a frequency FN, are applied to master-slave flip-flops 16 and 18 at the ports designated samp and latch. AND gate 12 receives differential input signals at ports $l_{p1}$ and $l_{nl}$ from the output of flip-flop 16, and differential input signals at ports $i_{p2}$ and $i_{n2}$ from the output of level shifter 20. The differential output of AND gate 12 is fed from ports $o_p$ and $o_n$ to, respectively, ports $l_n$ and $l_p$ of flip-flop 16.

Flip-flop 16 outputs a differential signal from ports $o_p$ and $o_n$ which is fed to, respectively, inputs $l_{n1}$ and $l_{p1}$ of second AND gate 14. Additionally, this signal is fed back to the inputs of first AND gate 12, as well as forwarded to ports samp and latch of flip-flop 18. AND gate 14 is also supplied with a differential input control signal designated by $ct3_p$ and $ct3_n$. The setting of this control signal determines whether circuit 10 will divide the frequency of the input clock signal by a factor of two or by a factor of three. The differential output of AND gate 14 is fed from ports $o_p$ and $o_n$ to, respectively, ports $l_n$ and $l_p$ of flip-flop 18. The differential output of flip-flop 18 is fed back to level shifter 20 which, in turn, supplies the differential input to AND gate 12.

The differential output of flip-flop 16 is also passed through level shifter 22, which outputs clock signals $ck23_p$ and $ck23_n$. This signal is the end output signal of circuit 10; it has a frequency FN/2 if control signal $ct3_p$ has a logical value of zero, and a frequency FN/3 if the control signal has a logical value of one. Looking at circuit 10 in FIG. 2, the reason for this result is apparent. So long as a logical zero (control signal $ct3_p$) is fed to AND gate 14, the output of AND gate 14 will remain a constant zero, irrespective of the value of the other input signal received by AND gate 14 from flip-flop 16. Hence, flip-flop 18, which receives the NAND'ed output of AND gate 14, will not change states and will generate a constant output of a logical one. The stage represented by AND gate 14 and flip-flop 18 is essentially taken out of the circuit and has no effect on the frequency of the output signal. Since AND gate 12 receives a logical one through level shifter 20, however, its output will change depending on the feedback input received from flip-flop 16. And, since the NAND'ed output of AND gate 12 is supplied to flip-flop 16, the output of flip-flop 16 will change with each rising clock pulse. The result is an output clock signal $ck23_p$ having a frequency FN/2.

Conversely, when control signal $ct3_p$ is set to a logical one, the output of AND gate 14 will vary depending on the value of the input signal received from flip-flop 16. In this scenario, both stages of the circuit are involved and both flip-flops regularly change states, thereby producing an output signal having a pulse frequency FN/3.

Figure 4:
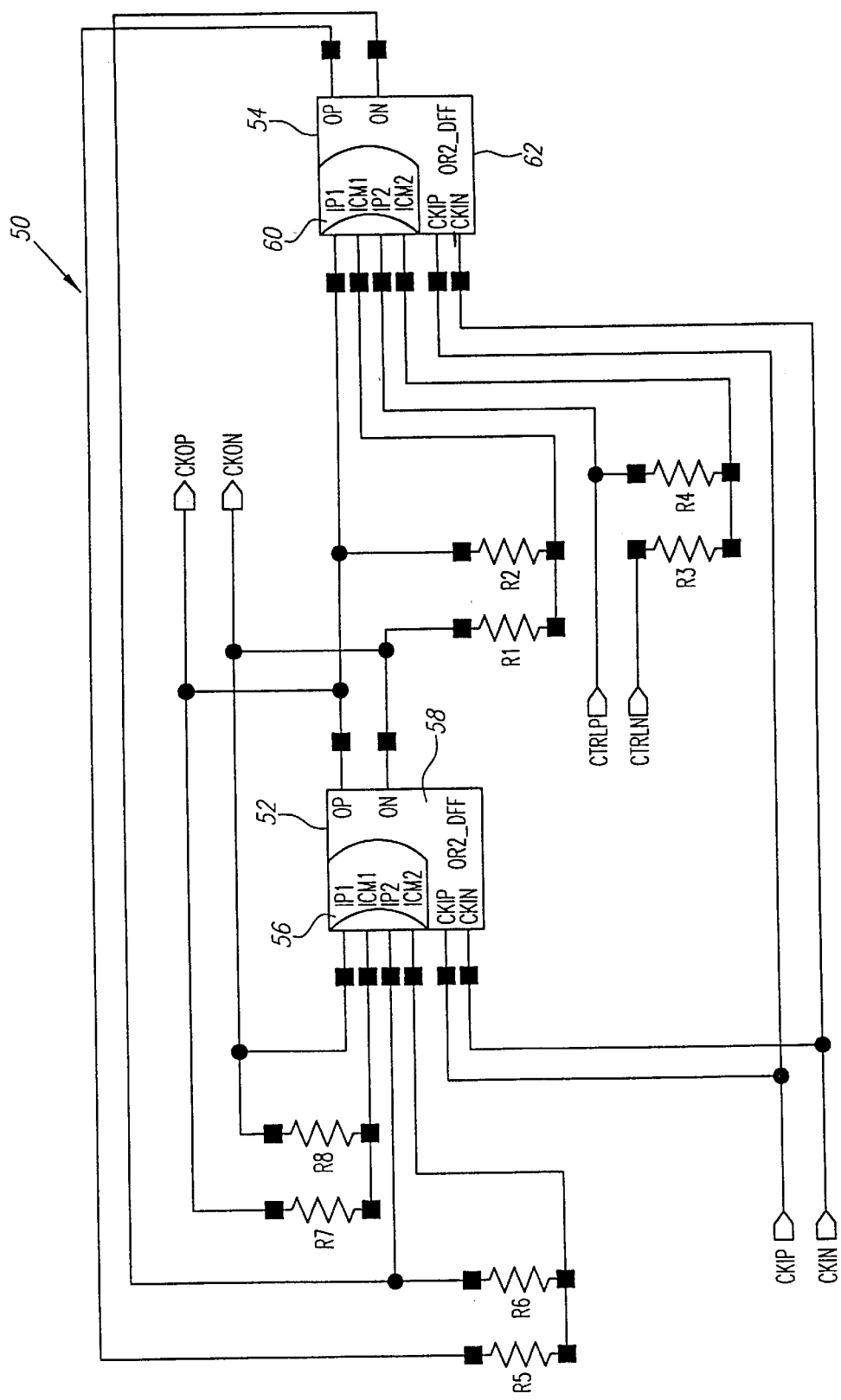
FIG. 4 is a schematic diagram illustrating the prescaler circuit of FIG. 3 in greater detail.
Figure 5:
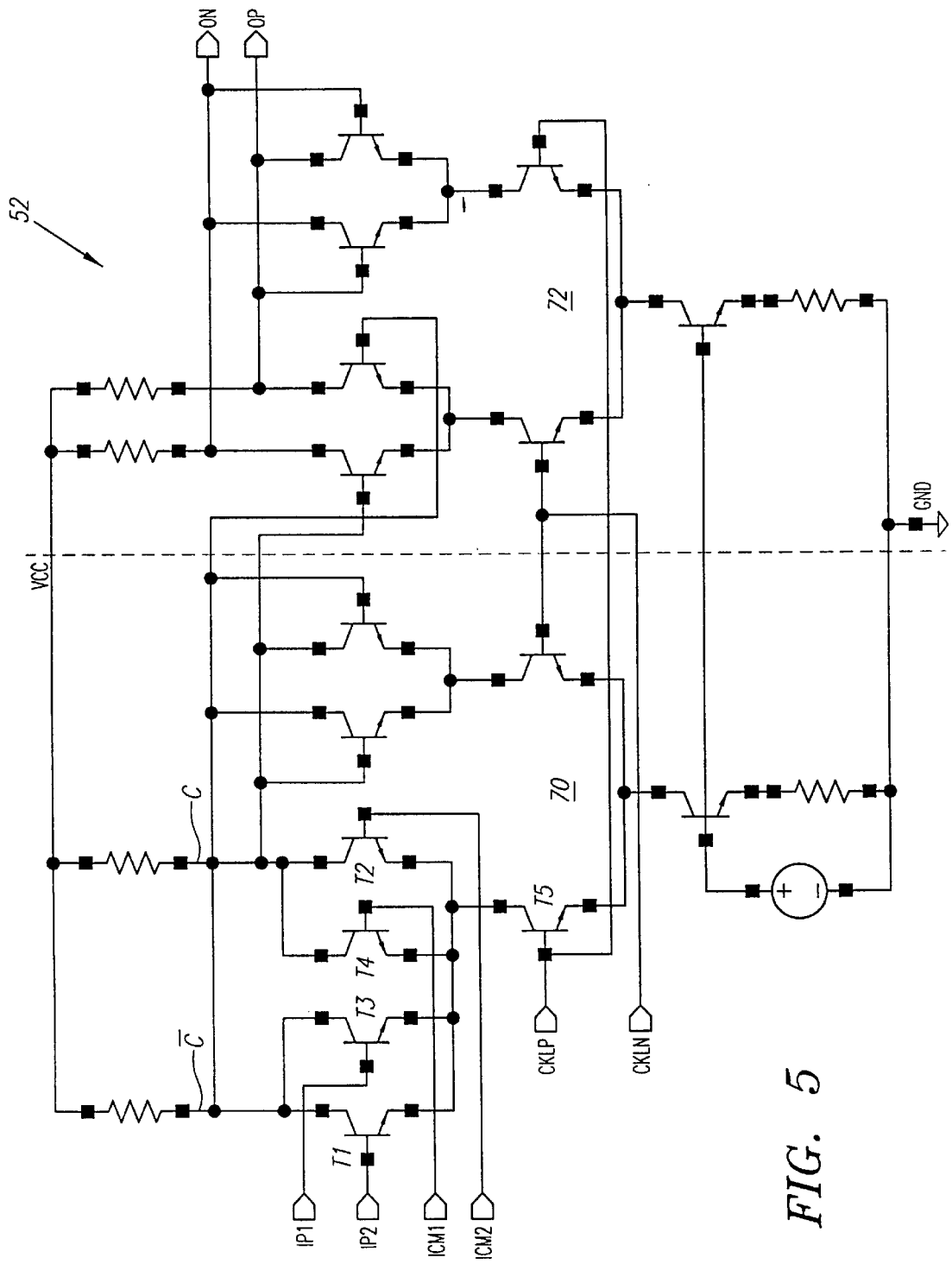
FIG. 5 is a schematic diagram illustrating the sub-circuitry of one of the merged OR/flip-flop logic blocks of the circuit of FIGS. 3 and 4.

The power consumed by circuit 10 is essentially equal to $V_{cc}*I_Q$ (the sum of the currents in the circuit). In order to reduce the power consumed, one may reduce $V_{cc}$ or one may reduce $I_Q$. In bipolar logic devices employing base-emitter junctions, however, the voltage cannot be scaled. Hence, reduction of $V_{cc}$ to effect a reduction in circuit power consumption is not a viable option. $I_Q$, however, is directly related to the size of and number of components in the circuit. Accordingly, if the size of the circuit can be reduced, for example, by removing or merging some of the circuitry components and designing a smaller loop, the current and power consumed by the circuit can also be reduced. This is the objective of the present invention, which is embodied in circuit 50 (FIGS. 3–5).

Circuit 50 performs the same function as circuit 10 described above, that is, it takes an input clock signal having a pulse frequency FN and generates an output signal having a divided pulse frequency of FN/2 or FN/3. Instead of utilizing AND gates serially connected with flip-flops, however, it merges or couples the OR and flip-flop logic to eliminate a level of logic. Circuit 10 has three levels of logic: the AND logic, the flip-flop logic and the level-shifting logic. The use by circuit 50 of OR gates rather than AND gates, and their merger (connection in parallel on the same IC chip) with the flip-flops, reduces the number of logic levels required. By implementing all logic on one level, the need for level shifters is also eliminated, and the amount of current consumed by the circuit is further reduced.

Figure 3:
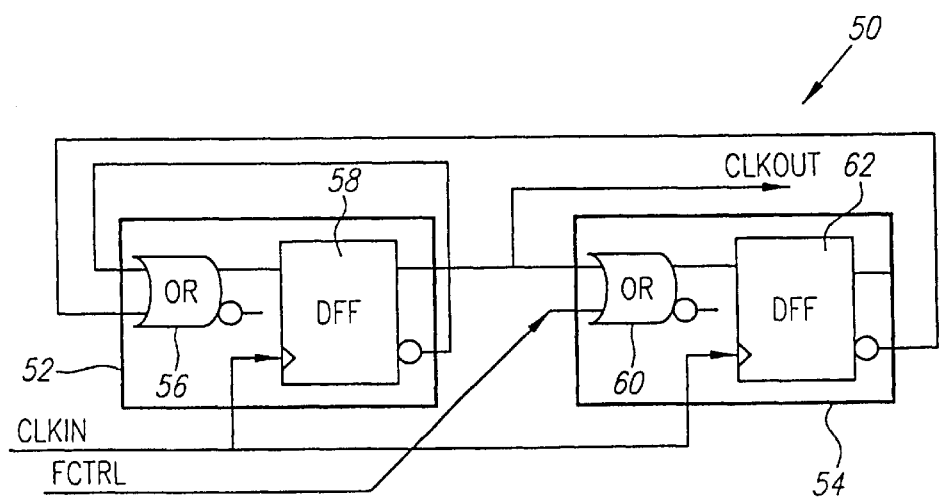
FIG. 3 is a block diagram illustrating a prescaler circuit according to the present invention.

Prescaler circuit 50 is illustrated in simplified block form in FIG. 3. It includes blocks 52 and 54, each of which is essentially a merger or coupling of an OR gate (56, 60) with a master-slave flip-flop (58,62). Circuit 50 produces the same results as circuit 10 described above: a clock pulse generator feeds a clock signal $clk_{in}$ having a pulse frequency FN into circuit 10 and, contingent on the setting of control signal $f_{ctrl}$, circuit 10 generates an output clock signal $clk_{out}$ having a pulse frequency of either FN/2 or FN/3.

The problem of common-mode noise still exists in circuit 50 and hence, differential signals are utilized as they were in circuit 10. In order to provide a stable, accurate output from the merged OR/flip-flop logic, however, single-ended or common-mode signals are needed at some of the inputs to the OR logic. To address this issue, circuit 50 utilizes primarily differential signals and, where a single-ended signal is needed, a common-mode signal is extracted from the two differential signals. In order to extract the common-mode signal, the two differential signals are summed and divided by two with a pair of high and equal value resistors, yielding the common-mode or average signal. Hence, circuit 50 is pseudo-differential in that it utilizes both single-ended (common mode) and double-ended (differential) signals.

Circuit 50 is illustrated in greater detail in FIG. 4. Each of blocks 52 and 54 is essentially OR logic merged with a master-slave flip-flop. The sub-circuitry of the merged OR/flip-flop blocks is illustrated in FIG. 5 and will be discussed in more detail herein. For purposes of the following discussion, however, it can simply be considered a block consisting of an OR gate (56, 60) whose output is coupled to the input of a master-slave flip-flop (58, 62).

Each of blocks 52 and 54 is connected to a supply voltage $V_{cc}$, a ground and a system bias voltage $v_{cs}$ (not shown). Differential clock signals $cki_p$ and $cki_n$ having a pulse frequency FN are supplied to the clock inputs of each of blocks 52 and 54. Second merged block 54 receives inputs as follows: at port $i_{p1}$, the positive component of the differential signal output from block 52; at port $i_{cm1}$, the common-mode signal generated from the differential outputs of block 52 by high value summing and dividing resistors $R_1$ and $R_2$; at port $i_{p2}$, the positive component $ctrl_p$ of the differential control signal; and at port $i_{cm2}$, the common-mode control signal generated by summing and dividing the differential components of the control signal through resistors $R_3$ and $R_4$.

The differential output of second block 54 is fed back to first block 52: the inverted component (from port $o_n$) of the differential output signal is coupled to input port $i_{p2}$ of block 52, and the common-mode signal generated by summing and dividing the differential outputs of block 54 through resistors $R_5$ and $R_6$ is coupled to input port $i_{cm2}$. Block 52 also receives feedback of its own output signals: the inverted component (from port $o_n$) of the differential output of block 52 is coupled to input port $i_{p1}$ of block 52; and the common-mode output signal generated by summing and dividing the differential outputs of block 52 through resistors $R_7$ and $R_8$ is connected to port $i_{cm1}$.

The differential output signals $cko_p$ and $cko_n$ of first block 52 have a pulse frequency of either FN/2 or FN/3, depending on the setting of the control signal supplied to second block 54. The operation of circuit 50 is similar to that of circuit 10, however, the effects of the control signal are reversed. A control signal of zero will yield an output signal having a pulse frequency FN/3, whereas a control signal of one will yield an output signal having a pulse frequency FN/2.

Operation of circuit 50 is as follows. A logical one input to OR gate 60 of block 54 will yield a constant output of one from OR gate 60 to flip-flop 62, irrespective of the value of the input signal received from block 52. Hence, flip-flop 62 will not change states or affect the pulse frequency as long as the control signal is a logical one. The inverted output of flip-flop 62 (zero, when the control signal is one) is fed to OR gate 56 of block 52. Accordingly, the output of OR gate 56 is contingent on the value of the feedback input signal received from flip-flop 58. Since it is the inverted value of the output signal of flip-flop 58 that is fed back, the output of flip-flop 58 will also change with each rising clock pulse, thereby generating an output clock signal $cko_p$ having a frequency FN/2.

Conversely, when control signal $ctrl_p$ is set to a logical zero, the output of OR gate 60 will vary depending on the value of the input signal received from block 52. In this case, both stages of the circuit are involved and both flip-flops regularly change states, thereby producing an output signal having a pulse frequency FN/3.

The sub-circuitry of merged or coupled OR/flip-flop block 52 is illustrated in FIG. 5. Block 54 utilizes identical circuitry. The right half 72 of the circuit is the slave latch portion of the flip-flop, the schematic of which is well known to those skilled in the art and will not be described in further detail herein. The left half 70 of the circuit is the master latch portion of the flip-flop. The master latch has been slightly altered to incorporate OR logic: a first transistor T1 has been placed in parallel with the conventionally configured transistor T3; and a second transistor T2 has been placed in parallel with the conventionally configured transistor T4. It is this placement of the transistors in parallel that effects the "merger" or coupling of the OR and the flip-flop logic. Hence, references in this specification to a merger or coupling of OR and flip-flop logic, or a merged OR/flip-flop block, refer to this placement of two transistors in parallel with the existing transistors of a master latch portion of a conventional master-slave flip-flop.

The emitters of each of transistors T1, T2, T3 and T4 are coupled to the input clock signal $cki_p$ via the collector of transistor T5. The base of transistor T1 is connected to the positive component $i_{p2}$ of a first differential signal; and the base of transistor T2 is connected to the common-mode signal $i_{cm2}$ derived from the first differential signal. The base of transistor T3 is connected to the positive component $i_{p1}$ of a second differential signal; and the base of transistor T4 is connected to the common-mode signal $i_{cm1}$ derived from the second differential signal. The collectors of transistors T1 and T3 are coupled together, as are the collectors of transistors T2 and T4.

The desired outputs of this modified OR portion of the circuit are designated C and $\overline{C}$ in FIG. 5. If either $i_{p1}$ or $i_{p2}$ has a logical value of one, C should have a value of one (logical high) and $\overline{C}$ should have a value of zero (logical low). Analyzing circuit 52, it is seen that this is the result. If the base voltage of either of transistors T1 or T3 is high (meaning either or both of $i_{p1}$ and $i_{p2}$ are logically high), a current will flow through the collectors of one or both of transistors T1 and T3, and current will be pulled away from transistors T4 and T2, whose bases are charged to the lesser common-mode voltage. Hence, little or no current will flow through resistor R10, requiring C to be approximately equal to $V_{cc}$, or logically high. Since current is flowing through the collectors of transistors T1 and/or T3 and through resistor R9, $\overline{C}$ will be less than $V_{cc}$, or logically low.

Conversely, when both $i_{p1}$ and $i_{p2}$ have a logical value of zero, current is pulled away from transistors T1 and T3 and towards transistors T2 and T4, whose bases are charged to the higher common-mode voltage. Hence, C will be logically low (due to current flowing through resistor R10, and $\overline{C}$ will be logically high (since no current flows through resistor R9, C must be approximately equal to $V_{cc}$). This is the correct result.

Notably, the correct result would not be obtained if, rather than applying the common-mode signals to transistors T2 and T4, one simply applied the inverted components of the differential signals to the transistors. Consider a case where the input to the base of transistor T1 is logically high and the input to the base of transistor T3 is logically low (or vice-versa). If the inverted components of these signals were simply applied to transistors T2 and T4, the base of transistor T2 would be logically high and the base of transistor T4 would be logically low. Both transistor pairs T1/T3 and T2/T4 would attempt to pull current, and a logically translatable result would not be obtained. Hence, it is necessary to utilize common-mode signals in order to obtain the desired outputs C and $\overline{C}$. The common-mode signals act as a middle ground, having a voltage low enough to pull little or no current when logically high signals are applied to one or both of transistors T1 and T3, but a voltage high enough to pull current when logical zeros are applied to both of transistors T1 and T3.

Comparing circuit 50 (FIG. 3) with circuit 10 (FIG. 1), it is notable that the five "blocks" required by circuit 10 have been reduced to two blocks in circuit 50. There is no need for a level shifter in circuit 50 since the extra level necessitated by the use of AND logic has been eliminated. With respect to the merger or coupling of the OR and flip-flop logic in circuit 50, even though two components are being merged into one, the resulting merged component does not consume twice the current of the individual components. In the merged logic, common collectors are present from two devices that must be charged at the same time, resulting in a doubled capacitance. However, due to the relationship of the charging time with the input capacitance and a time constant related to output capacitance, the current does need not be doubled in order to charge the two devices. A current savings of nearly fifty percent is realized.

While particular embodiments of the present invention have been described above, it should be understood that they have been presented by way of example only, and not as limitations. The breadth and scope of the present invention is defined by the following claims and their equivalents, and is not limited by the particular embodiments described herein.

What is claimed is:

1. A prescaler circuit for a frequency synthesizer comprising: a first circuit block having a first OR gate merged with a first master-slave flip-flop; a second circuit block having a second OR gate merged with a second master-slave flip-flop; an input clock signal having a frequency FN which is input to said first and second blocks; and means for generating a first common-mode signal from a first differential output signal and an output signal generated by said first circuitry block having a frequency of FN/N second differential output signal.

2. A prescaler circuit as claimed in claim 1, wherein N is selected from a group consisting of two or three.

3. A prescaler circuit as claimed in claim 2, and further comprising a control signal which is input to said second OR gate, said control signal being determinative of whether N=2 or N=3.

4. A prescaler circuit as claimed in claim 3, wherein said first differential output signal generated by a first circuit block and a second differential output signal generated by said second circuit block.

5. A prescaler circuit as claimed in claim 4, wherein said means for generating said common-mode signals comprise high value summing and dividing resistors.

6. A prescaler circuit as claimed in claim 5, wherein said first OR gate receives at its input side: an inverted component of said first differential output signal; said first common-mode signal; an inverted component of said second differential output signal; and said second common-mode signal.

7. A prescaler circuit as claimed in claim 6, wherein said first circuit block comprises transistors T1, T2, T3 and T4; wherein the emitters of said transistors are coupled together; wherein the collectors of transistors T1 and T3 are coupled together; wherein the collectors of transistors T2 and T4 are coupled together; and wherein the base of transistor T1 is coupled to said inverted component of said first differential output signal, the base of transistor T3 is coupled to said inverted component of said second differential output signal, the base of transistor T2 is coupled to said second common-mode signal, and the base of transistor T4 is coupled to said first common-mode signal.

8. A prescaler circuit as claimed in claim 4, wherein said second OR gate receives at its input side: a positive component of said first differential output signal; said first common-mode signal; a positive component of said control signal; and a common-mode control signal formed by summing and dividing said positive component and a negative component of said control signal.

9. A prescaler circuit as claimed in claim 8, wherein said second circuit block comprises transistors T1, T2, T3 and T4; wherein the emitters of said transistors are coupled together; wherein the collectors of transistors T1 and T3 are coupled together; wherein the collectors of transistors T2 and T4 are coupled together; and wherein the base of transistor T1 is coupled to said positive component of said first differential output signal, the base of transistor T3 is coupled to said positive component of said control signal, the base of transistor T2 is coupled to said common-mode control signal, and the base of transistor T4 is coupled to said first common-mode signal.

10. A prescaler circuit as claimed in claim 4, wherein said input and output clock signals are differential signals.

11. A prescaler circuit for scaling frequencies in a frequency synthesizer of a wireless communications device comprising: logic means for generating a differential output signal having a frequency FN/n from a differential input signal having a frequency FN; control means for setting a value of n; summing and dividing means for generating a common-mode signal from said differential output signal and wherein said logic means comprises two circuit blocks, each said block comprising an OR gate merged with a master-slave flip-flop.

12. A prescaler circuit as claimed in claim 11, wherein said OR gate is merged with said master-slave flip-flop by placing two transistors T1 and T2 in parallel with existing transistors T3 and T4 of a master latch portion of said master-slave flip-flop.

13. A prescaler circuit as claimed in claim 11, wherein said summing and dividing means comprises two high value resistors.

14. A method for prescaling a frequency by a factor of 2 or 3 comprising the steps of:
providing first and second circuit blocks, each said block comprising an OR gate coupled with a master-slave flip-flop;
inputting a clock signal having a frequency FN to each said block;
inputting a control signal to one of said blocks;
outputting a signal having a frequency FN/n from one of said blocks, wherein n has a value which is dependent on the value of said control signal;
generating first and second differential output signals from said blocks;
generating first and second common-mode signals from said first and second differential signals;
inputting said first and second common-mode signals to said first block; and
inputting said control signal and said first common-mode signal to said second block.

15. A frequency synthesizer comprising:
a prescaler;
wherein the prescaler comprises;
a first circuit block having a first OR gate merged with a first master-slave flip-flop;
a second circuit block having a second OR gate merged with a second master-slave flip-flop;
an input clock signal having a frequency FN which is in put to said first and second blocks;
an output signal generated by said first circuitry block having a frequency of FN/N and means for generating a first common-mode signal from a first differential output signal and a second common-mode signal from a second differential output signal.

16. The frequency synthesizer as claimed in claim 15, wherein the prescaler is a dual-modulus prescaler.

17. The frequency synthesizer as claimed in claim 16, wherein N is selected from a group consisting of two or three.

* * * * *